United States Patent [19]

Niwayama

[11] Patent Number: 4,974,047
[45] Date of Patent: Nov. 27, 1990

[54] LIGHT TRIGGERED THYRISTOR

[75] Inventor: Kazuhiko Niwayama, Itami, Japan

[73] Assignee: Mitsubishi Denki Kabushiki Kaisha, Tokyo, Japan

[21] Appl. No.: 298,262

[22] Filed: Jan. 13, 1989

Related U.S. Application Data

[63] Continuation of Ser. No. 880,655, Jun. 30, 1986, abandoned, which is a continuation of Ser. No. 553,990, Nov. 21, 1983, abandoned.

[30] Foreign Application Priority Data

Nov. 26, 1982 [JP] Japan .................. 57-208202

[51] Int. Cl.$^5$ ............. H01L 29/06; H01L 27/14; H01L 29/06
[52] U.S. Cl. ........................ 357/38; 357/20; 357/30; 357/55
[58] Field of Search .............. 357/20, 30, 38, 55

[56] References Cited

U.S. PATENT DOCUMENTS

| | | | |
|---|---|---|---|
| 4,016,592 | 4/1977 | Yatsuo et al. | 357/30 |
| 4,047,219 | 9/1977 | Temple | 357/38 |
| 4,368,481 | 6/1980 | Ohashi et al. | 357/30 |

FOREIGN PATENT DOCUMENTS

| | | | |
|---|---|---|---|
| 2746406 | 4/1978 | Fed. Rep. of Germany | 357/38 LA |
| 2715482 | 10/1978 | Fed. Rep. of Germany | 357/38 LA |
| 0134971 | 10/1980 | Japan | 357/38 LA |
| 0056671 | 5/1981 | Japan | 357/39 LA |

Primary Examiner—Rolf Hille
Assistant Examiner—Wael Fahmy
Attorney, Agent, or Firm—Birch, Stewart, Kolasch & Birch

[57] ABSTRACT

A light triggered thyristor having a light-receiving structure which has a light-receiving surface for receiving incident light on its top surface. The light-receiving structure comprises a base region of a first electrically conductive type exposed in the light-receiving surface, and an emitter region of a second electrically conductive type exposed in a central portion of the light-receiving surface as well as in an area extending from a part of the central portion thereof outwardly beyond the light-receiving surface, and an electrode connected to the base region and the emitter region outside the light-receiving surface, wherein a lateral resistance in the area of the base region between areas underlying the emitter region is aprpoximately equal to or larger than a lateral resistance in the area thereof below the emitter region.

6 Claims, 4 Drawing Sheets

LIGHT TRIGGERED THYRISTOR

This application is a continuation of application Ser. No. 06/880,655 filed on June 30, 1986, which is a continuation of Ser. No. 06/553,990 filed Nov. 21, 1983, both of which are now abandoned.

FIELD OF THE INVENTION

The present invention relates to a light triggered thyristor which has a unique light-receiving structure whereby the light-triggering sensitivity is considerably enhanced.

BACKGROUND OF THE INVENTION

To explain a typical example of known light triggered thyristors, reference will be made to FIGS. 1 (a) and (b), which schematically show a vertical cross-section of its light-receiving section and a plan view thereof, respectively. An n-type semiconductor substrate 1 has a p-type, that is, first electrically conductive type base region 3 in its main surface 2, and a p-type emitter region 4 in the opposite surface 4. The p-type base region 3 has a light-receiving surface 5 having a radius of (a), around which an n-type, that is, second electrically conductive type emitter region 6a of a ring shape is concentrically provided. The ring-shaped emitter region 6a has an inside radius of (a), and an outside radius of (c). The reference numeral 7 designates a negative electrode of a ring shape having an outside radius of (b) and an inside radius of (d), and negative electrode 7 being kept in surfacial contact with the n-type emitter region 6a and with the p-type base region 3 outside the n-type emitter region 6a so as to secure electrical connection to each of them. The reference numeral 8 designates a positive electrode provided on the surface of the p-type emitter region 4. In addition, there is provided a light guide 9 above the light-receiving surface 5. The light passing through the light guide 9 is cast on the light-receiving surface 5 as a trigger light 10.

When the light triggered thyristor constructed in the above-mentioned manner is biased, and the trigger light 10 is projected on the light-receiving surface 5 through and from the light guide 9, the trigger light 10 penetrates the light-receiving surface 5, and generates a light-excited current 11a inside the p-type base region 3. This current flows therethrough, and reaches the negative electrode 7. At this stage, a voltage drop occurs in that area of the p-type base region 3 which is located below the n-type emitter region 6a, because of a lateral resistance $R_A$ existing in this area, thereby causing the junction between the p-type base region 3 and the n-type emitter region 6a to be forward-biased. Thus electrons are injected into the p-type base region 3 from the n-type emitter region 6a, whereby the light triggered thyristor is switched on. At this moment the minimum light-triggering energy $P_{LT}$ is expressed by the equation (1):

$$P_{LT} = \frac{V^*}{y_A R_A} = \frac{V^*}{y_A \dfrac{r_S}{2\pi} \ln \dfrac{c}{a}} \quad (1)$$

Where
$V^*$ : the critical voltage for causing the injection of electrons;
$y_A$ : quantum yield;
$r_S$ : a sheet resistance in the p-type base region under the n-type emitter region In order to increase the sensitivity of the light-triggering; in other words, to reduce the value of the $P_{LT}$, it is necessary to increase the $R_A$. FIG. 2 shows a modified light-receiving section in the known light triggered thyristor, in which the n-type emitter region 6b is expanded so as to cover the area under the light-receiving surface 5. The remaining structure is the same as that illustrated in FIG. 1. By virtue of this arrangement a lateral resistance $R_B$ in the p-type base region 3 under the n-type emitter region 6b becomes larger than the $R_A$ referred to with respect to FIG. 1. Here, the minimum light-triggering energy $P_{LT}$ is given by the equation (2):

$$P_{LT} = \frac{V^*}{y_B r_B} = \frac{V^*}{y_B \dfrac{r_S}{2\pi} \left( \ln \dfrac{c}{a} + \dfrac{1}{2} \right)} \quad (2)$$

where $y_B$ : quantum yield

Now, suppose that the values of $r_S$ and $V^*$ are the same as those shown with respect to FIG. 1, and that $y_A = y_B$ is established, it will be appreciated from the comparison of both equations (1) and (2) that the structure of the light-receiving section illustrated in FIG. 2 is superior in light-triggering sensitivity to that of FIG. 1. In fact, however, $y_A$ is larger than $y_B$. The reason is that under the structure illustrated in FIG. 1 the p-type base region 3 is exposed in the whole light-receiving surface 5, whereby the trigger light 10 is wholly used to generate the light-excited current 11a. Whereas, under the structure illustrated in FIG. 2 the whole light-receiving surface 5 is covered with the n-type emitter region 6b, whereby the trigger light 10 must penetrate the n-type emitter region 6b so as to reach the p-type base region 3. During the penetration the trigger light 10 is partially absorbed in the n-type emitter region 6b, and the absorbed portion hardly contributes to the generation of the light-excited current 11b. This prevents the enhancement of the light-triggering sensitivity, which is quite contrary to expectation.

As evident from the foregoing description, the known light triggered thyristors have a low light-triggering sensitivity; in the example illustrated in FIG. 1 the lateral resistance in the area of p-type base region 3 below the n-type emitter region 6a is too small to increase the sensitivity. In the modified example of FIG. 2 the quantum yield is reduced, which results in a low sensitivity. To increase the quantum yield, it is recommended to intensify the trigger light 10, which, however, leads to a costly optical system.

OBJECTS AND SUMMARY OF THE INVENTION

The present invention is directed to solve the problems pointed above, and has for its object to provide an improved light triggered thyristor having such a structure for light-reception that the sensitivity of light-triggering is considerably enhanced on an economical basis.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a light triggered thyristor, comprising:
- a light-receiving surface for receiving incident;
- a base region of a first electrically conductive type provided in a main surface of a semiconductor substrate such that the base region is exposed at the light-receiving surface;
- an emitter region of a second electrically conductive type which is exposed at the central portion of the light-receiving surface as well as in an area extending from a part of the central portion thereof outwardly beyond the light-receiving surface;
- an electrode connected to the base region and the emitter region outside the light-receiving surface, wherein a lateral resistance in the area of the base region between the emitter regions and extending from the light-receiving surface up to the electrode is approximately equal to or larger than a lateral resistance in the area thereof below the emitter region.

DETAILED DESCRIPTION OF THE INVENTION

Figure 1A:
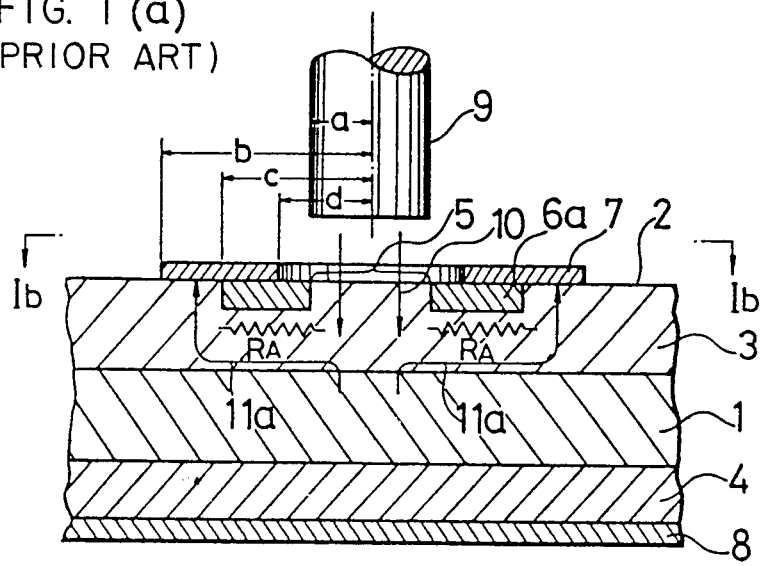
FIG. 1 is a schematic view showing an example of the known light triggered thyristors, in which the (a) is a vertical cross-section, and the (b) is a plan view from the line Ib—Ib of FIG. 1(a)

The invention will be now described with reference to FIG. 3 and 4, however, like reference numerals are used throughout FIGS. 1 to 4 to designate like parts and elements. No description will be made with respect to the parts and elements which have been referred to in the foregoing description of the background of the invention.

Figure 3:
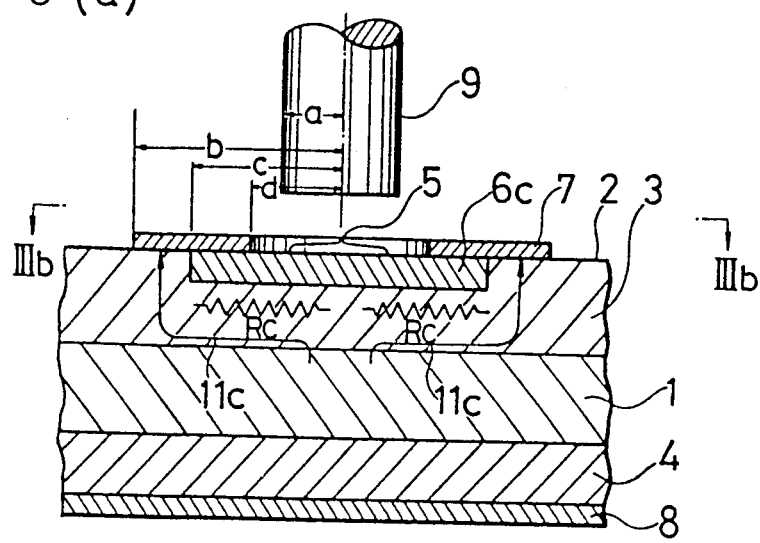
FIG. 3 is a schematic view showing an example of the embodiment according to the present invention, in which the (a) is a vertical cross-section and the (b) is a plan view from the line IIIb—IIIb of FIG. 3(a)
Figure 3:
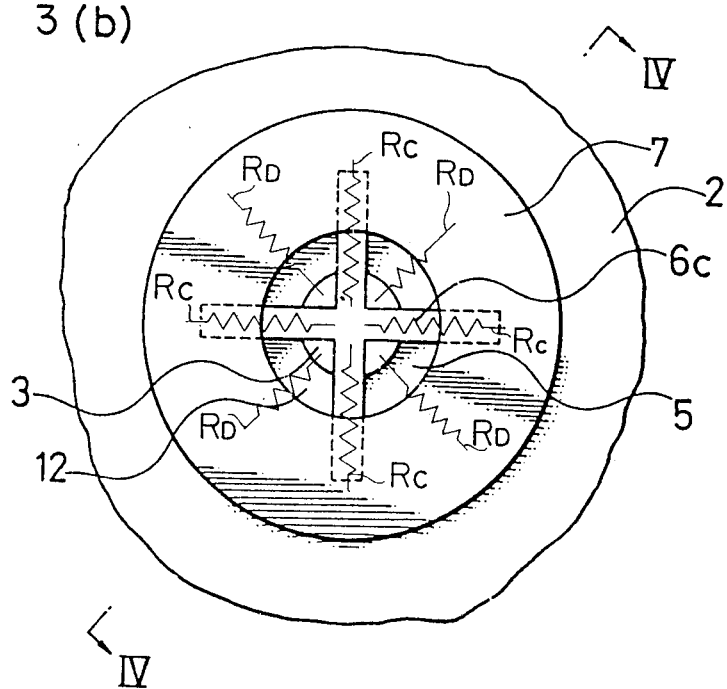
Figure 4:
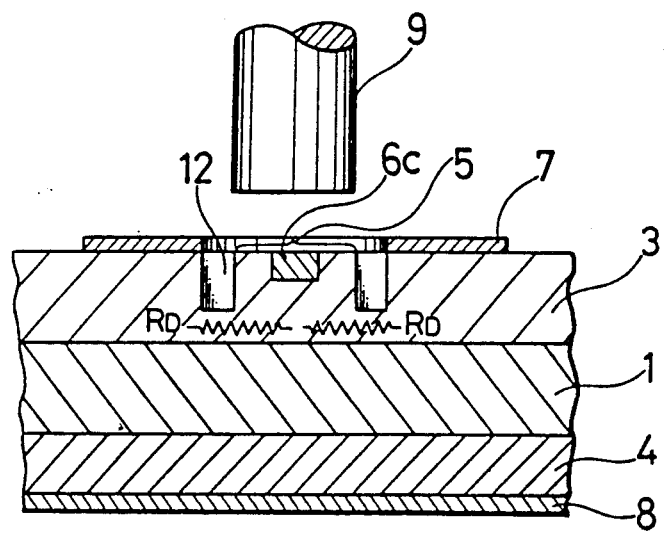
FIG. 4 is a schematic view showing another vertical cross-section of the embodiment in line IV—IV of FIG. 3(b).

Referring to FIG. 3(a), an n-type emitter region 6c is produced in a cross-shape, which, as well known, consists of intersecting four branches of equal length as clearly shown in FIG. 3(b) which is a top plan view taken along IIIb—IIIb of FIG. 3(a). By taking this shape the n-type emitter region 6c occupies a central part of the light-receiving surface 5. Referring to FIG. 4, which is a sectional view taken along line IV—IV of FIG. 3, area in the p-type base region 3 which is located between the light-receiving surface 5 and the electrode 7, is formed with a groove 12, except in the areas under which the n-type emitter region 6c is located. The groove 12 has a greater depth than the thickness of the n-type emitter region 6c such that a lateral resistance $R_D$ in the area of the p-type base region 3 between emitter regions 6c and extending from the light-receiving surface 5 to the electrode 7 (which area is located below the groove 12) becomes larger than a lateral resistance $R_C$ in the p-type base region 3 below the n-type emitter region 6c. The distance from the center of the cross-shaped light-receiving surface 5 to the terminating end of each branch of the cross is (c). Alternating areas of resistance $R_C$ and $R_D$ are diagrammatically illustrated in FIG. 3(b).

In the embodiment illustrated in FIG. 3, a light-excited current 11c flows through the p-type base region 3 below the n-type emitter region 6c, and it is possible to consider a lateral resistance as $R_C$. The lateral resistance $R_C$ is equal to $R_B$ in FIG. 2, and the minimum light-triggering energy $P_{LT}$ is expressed by the following equation (3):

$$P_{LT} = \frac{V^*}{y_C R_C} = \frac{V^*}{y_C \frac{r_S}{2\pi} \left( \ln \frac{c}{a} + \frac{1}{2} \right)} \quad (3)$$

where $y_C$: quantum yield

Figure 1B:
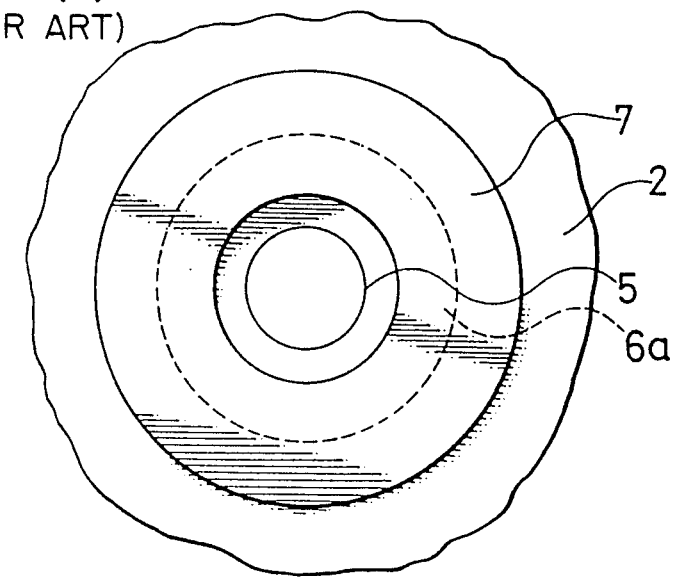
Figure 2A:
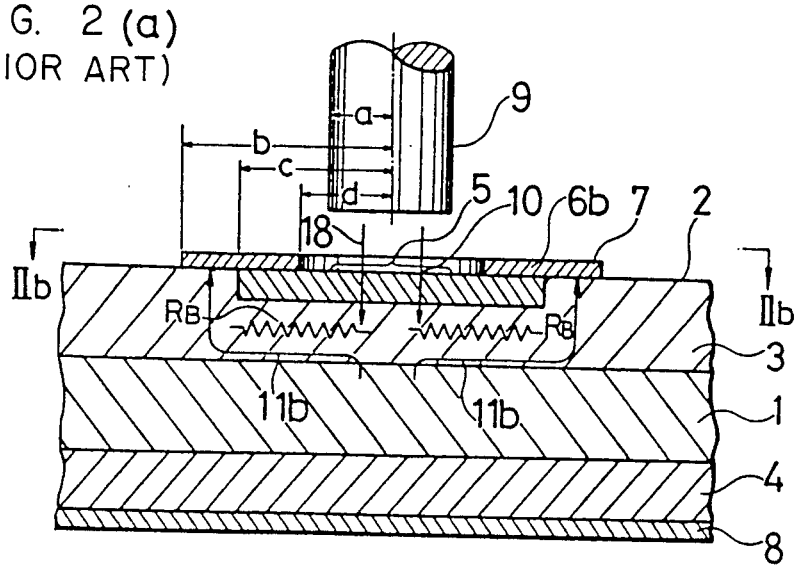
FIG. 2 is a schematic view showing another example of the known light triggered thyristors, in which the (a) is a vertical cross-section, and the (b) is a plan view from the line IIb—IIb of FIG. 2(a)
Figure 2B:
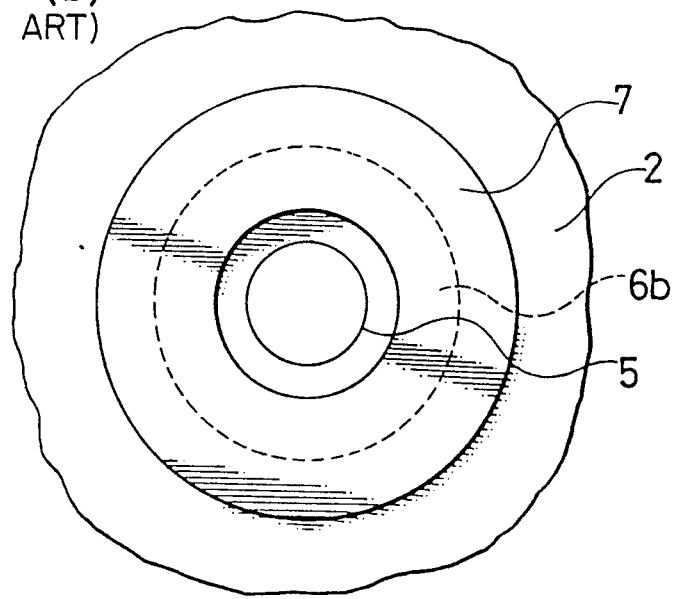

Herein, suppose that the values of $r_S$ and $V^*$ are the same as those of FIG. 1, the value of $y_C$ (quantum yield) will be a decisive factor. As mentioned above with respect to FIG. 2, because of the fact that the light-receiving surface 5 is covered with the n-type emitter region 6b, the incident trigger light 10 through the light guide 9 wholly passes through the n-type emitter region 6b. In contrast, in the embodiment of FIG. 3 because of the cross-shaped n-type emitter region 6c, the p-type base region 3 is partly exposed to the trigger light 10, thereby allowing a greater part of the trigger light to be contributive to produce the light-excited current 11c. This greatly increases the quantum yield $y_C$. Accordingly, the $y_C$ is greater than $y_B$, thereby enhancing the light-triggering sensitivity.

In the above-mentioned embodiment the groove 12 is located outside the light-receiving surface 5, but alternatively, the groove 12 can be produced in such a manner as to include the light-receiving surface 5. The groove 12 is intended to increase the resistance, and instead of providing the groove 12, it is possible that the impurity density of the exposed area of the p-type base region in the light-receiving surface 5 as well as that of the area outside it up to the electrode 7 is made lower than the impurity density of the p-type base region below the n-type emitter region 6c.

In addition, the above-mentioned embodiment has a cross-shaped n-type emitter region 6c in which the four branches extend at right angle to each other from the center of the light-receiving surface 5, but the branches can be radial thereof, or in any other form, provided that the n-type emitter region 6c extends beyond the light-receiving surface 5.

In the above-mentioned embodiment the base region is of a p-type, and the emitter region is of an n-type, but they can be of reversed type without affecting the resulting effects.

As described in the foregoing, a light triggered thyristor of the present invention has a base region of a first electrically conductive type exposed at the light-receiving surface, an emitter region of second electrically conductive type exposed in a central portion of the light-receiving surface as well as in an area extending from a part of the central portion thereof outwardly beyond the light-receiving surface, and an electrode connected to the base region and the emitter region outside the light-receiving surface. Because of the structure a lateral resistance in the area of the base region between the emitter regions is approximately equal to or larger than a lateral resistance in the area thereof below the emitter regions, the resistance in the area in which the light-excited current flows is increased. In addition, the trigger light is projected directly on a part of the base region, thereby achieving a high quantum yield, which considerably enhances the light-triggering sensitivity without the need for introducing a costly optical system.

What is claimed is:

1. A light triggered thyristor comprising:
   a light-receiving surface for receiving incident light;
   a base region of a first electrically conductive type provided in a main surface of a semiconductor substrate such that at least part of the base region is exposed to the incident light at the light-receiving surface;
   an emitter region of a second electrically conductive type having spaced radial branches overlying predetermined areas of the base region at a central portion of the light-receiving surface, said radial branches extending from the center of said light-receiving surface outwardly beyond the light-receiving surface; and
   an electrode connected to the base region and the radial branches of said emitter region outside the light-receiving surface,
   wherein lateral resistance in first base region areas being exposed and extending from the light-receiving surface to the electrode, which are between said radial branches of the emitter region, is approximately equal to or larger than lateral resistance in second base region areas being unexposed and extending from below the center of the light-receiving surface to the electrode below each of the radial branches of the emitter region, said first base region areas each having a groove defined therein to increase lateral resistance;
   whereby portions of said base region are directly exposed to said incident light between the radial branches of the emitter region, thereby enhancing the quantum yield of the thyristor and decreasing the amount of light energy required to trigger the thyristor into conduction.

2. The light triggered thyristor as defined in claim 1, wherein the radial branches of the emitter region are formed in a cross-shape, the electrode is formed in a ring-shape concentric with the light-receiving surface but having an inside diameter greater than the diameter of said light-receiving surface, and said grooves have a depth greater than the thickness of said emitter region.

3. The light triggered thyristor as defined in claim 2, wherein said grooves are disposed in said first base region areas outside the light-receiving surface of said first base region areas.

4. The light triggered thyristor as defined in claim 2, wherein said grooves are disposed in said first base region areas including portions of said light-receiving surface of said first base region areas.

5. A light triggered thyristor comprising:
   a light-receiving surface for receiving incident light;
   a base region of a first electrically conductive type provided in a main surface of a semiconductor substrate such that at least part of the base region is exposed to the incident light at the light-receiving surface;
   an emitter region of a second electrically conductive type having spaced radial branches overlying predetermined areas of the base region at a central portion of the light-receiving surface, said radial branches extending from the center of said light-receiving surface outwardly beyond the light-receiving surface; and
   an electrode connected to the base region and the radial branches of said emitter region outside the light-receiving surface,
   wherein lateral resistance in first base region areas being exposed and extending from the light-receiving surface to the electrode, which are between said radial branches of the emitter region, is approximately equal to or larger than lateral resistance in second base region areas being unexposed and extending from below the center of the light-receiving surface to the electrode below each of the radial branches of the emitter region, said first base region areas each having an impurity density lower than the impurity density of said second base region areas to increase lateral resistance;
   whereby portions of said base region are directly exposed to said incident light between the radial branches of the emitter region, thereby enhancing the quantum yield of the thyristor and decreasing the amount of light energy required to trigger the thyristor into conduction.

6. The light triggered thyristor of claim 5, wherein the radial branches of the emitter region are formed in a cross-shape, and the electrode is formed in a ring-shape concentric with the light-receiving surface but having an inside diameter greater than the diameter of said light-receiving surface.

* * * * *